US011828793B2

United States Patent
Phan et al.

(10) Patent No.: US 11,828,793 B2
(45) Date of Patent: Nov. 28, 2023

(54) TESTING APPARATUS FOR TEMPERATURE TESTING OF ELECTRONIC DEVICES

(71) Applicant: Western Digital Technologies, Inc., San Jose, CA (US)

(72) Inventors: Ba Duong Phan, North Tustin, CA (US); Alireza Daneshgar, Irvine, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 75 days.

(21) Appl. No.: 17/412,889

(22) Filed: Aug. 26, 2021

(65) Prior Publication Data

US 2023/0060664 A1 Mar. 2, 2023

(51) Int. Cl.

| G01R 1/02 | (2006.01) |
| G01R 1/04 | (2006.01) |
| G01R 1/067 | (2006.01) |
| G01R 1/073 | (2006.01) |
| G01R 31/28 | (2006.01) |
| G05B 15/02 | (2006.01) |

(Continued)

(52) U.S. Cl.
CPC ............. *G01R 31/287* (2013.01); *G01R 1/04* (2013.01); *G01R 1/44* (2013.01)

(58) Field of Classification Search
CPC . G01R 1/02; G01R 1/04; G01R 1/067; G01R 1/073; G01R 1/44; G01R 31/02; G01R 31/28; G01R 31/287; G05B 15/02; G06F 1/20

See application file for complete search history.

(56) References Cited

U.S. PATENT DOCUMENTS

| 7,343,775 B2 | 3/2008 | Cunningham et al. |
| 7,873,885 B1 | 1/2011 | Shin et al. |
| 7,920,380 B2 | 4/2011 | Merrow et al. |

(Continued)

FOREIGN PATENT DOCUMENTS

| CN | 212255570 U | 12/2020 |
| JP | 2006308368 A | 11/2006 |

(Continued)

OTHER PUBLICATIONS

International Search Report and Written Opinion dated Sep. 27, 2022 from International Application No. PCT/US2022/030626, 10 pages.

(Continued)

*Primary Examiner* — Neel D Shah
(74) *Attorney, Agent, or Firm* — Barry IP Law, P.C.

(57) ABSTRACT

A testing apparatus for Devices Under Test (DUTs) includes at least one intake damper and at least one exhaust damper. At least one fan moves recirculated fluid and exterior fluid across one or more DUTs inside the testing apparatus. In one aspect, the testing apparatus includes a door to provide access to a chamber and the door includes at least one channel. At least a portion of the fluid flows through the at least one channel of the door. In another aspect, the door is configured to provide access to a chamber from the front of the chamber and the fluid is moved in a direction across the one or more DUTs substantially from the front of the chamber towards a rear of the chamber.

20 Claims, 7 Drawing Sheets

(51) Int. Cl.
*G06F 1/20* (2006.01)
*G01R 1/44* (2006.01)

(56) References Cited

U.S. PATENT DOCUMENTS

| | | | |
|---|---|---|---|
| 8,451,608 B2 | 5/2013 | Merrow | |
| 9,163,844 B2 | 10/2015 | Tangney | |
| 9,310,427 B2 | 4/2016 | Kushnick et al. | |
| 9,429,623 B2 | 8/2016 | Filler et al. | |
| 9,715,896 B2 | 7/2017 | Rancour et al. | |
| 9,894,807 B2 * | 2/2018 | Bard | H05K 7/20181 |
| 10,146,279 B2 | 12/2018 | Vyshetsky | |
| 10,631,432 B2 | 4/2020 | Gopalakrishna et al. | |
| 2002/0149911 A1 * | 10/2002 | Bishop | H05K 7/20836 361/690 |
| 2007/0034368 A1 | 2/2007 | Atkins et al. | |
| 2008/0239649 A1 | 10/2008 | Bradicich et al. | |
| 2009/0082907 A1 | 3/2009 | Stuvel et al. | |
| 2013/0047650 A1 | 2/2013 | Moss | |
| 2014/0077829 A1 | 3/2014 | Oh et al. | |
| 2014/0236526 A1 | 8/2014 | Frediani et al. | |
| 2014/0290023 A1 | 10/2014 | Kay | |
| 2015/0294735 A1 | 10/2015 | Gao et al. | |
| 2016/0139198 A1 | 5/2016 | Park et al. | |
| 2018/0313890 A1 | 11/2018 | Wolff | |
| 2019/0277907 A1 | 9/2019 | Wolff et al. | |
| 2020/0200819 A1 | 6/2020 | Malisic et al. | |

FOREIGN PATENT DOCUMENTS

| | | |
|---|---|---|
| JP | 2007333559 A | 12/2007 |
| JP | 2011252717 A | 12/2011 |
| JP | 2015087204 A | 5/2015 |
| JP | 2016156798 A | 9/2016 |

OTHER PUBLICATIONS

International Search Report and Written Opinion dated Oct. 27, 2022 from International Application No. PCT/US2022/030623, 11 pages.

Pending U.S. Appl. No. 17/458,045, filed Aug. 26, 2021, entitled "Testing Apparatus for Data Storage Devices", Ba Duong Phan.

Go Semi & Beyond; "Q&A Interview with Scott West—Expanding SSD Test Capabilities for Extreme Temperatures"; Dec. 16, 2019; available at: https://www.gosemiandbeyond.com/qa-interview-with-scott-west-expanding-ssd-test-capabilities-for-extreme-temperatures/.

Wan et al.; "Air Flow Measurement and Management for Improving Cooling and Energy Efficiency in Raised-Floor Data Centers: A Survey"; IEEE Xplore; Aug. 30, 2018; 35 pages; available at https://ieeexplore.ieee.org/document/8451865.

Scott West; Global Technology, Innovation and Research Group; Advantest America; "Applying Flexible ATE Technology to Protocol Test and the SSDMarket"; Go Semi & Beyond; Nov. 9, 2016; available at https://www.gosemiandbeyond.com/applying-flexible-ate-technology-to-protocol-test-and-the-ssd-market/.

* cited by examiner

TESTING APPARATUS FOR TEMPERATURE TESTING OF ELECTRONIC DEVICES

CROSS-REFERENCE TO RELATED APPLICATION

This application is related to U.S. application Ser. No. 17/458,045 titled "TESTING APPARATUS FOR DATA STORAGE DEVICES", filed on Aug. 26, 2021, which is hereby incorporated by reference in its entirety.

BACKGROUND

Manufacturers of electronic devices often test the devices, referred to as a Device Under Test (DUT), under different temperature conditions. For example, Solid State Drives (SSDs) or other types of Data Storage Devices (DSDs) are often tested before leaving the factory at different temperatures to ensure quality control in terms of data retention and operating performance, or to determine maximum operating temperatures. In some cases, many DSDs may be simultaneously temperature tested inside a testing apparatus. However, such simultaneous temperature testing of DSDs using conventional testing apparatuses typically suffers from varying temperatures at different locations throughout a testing chamber of the testing apparatus. This uneven temperature distribution in conventional testing apparatuses results in inconsistent test results for the devices being tested.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Figure 1:
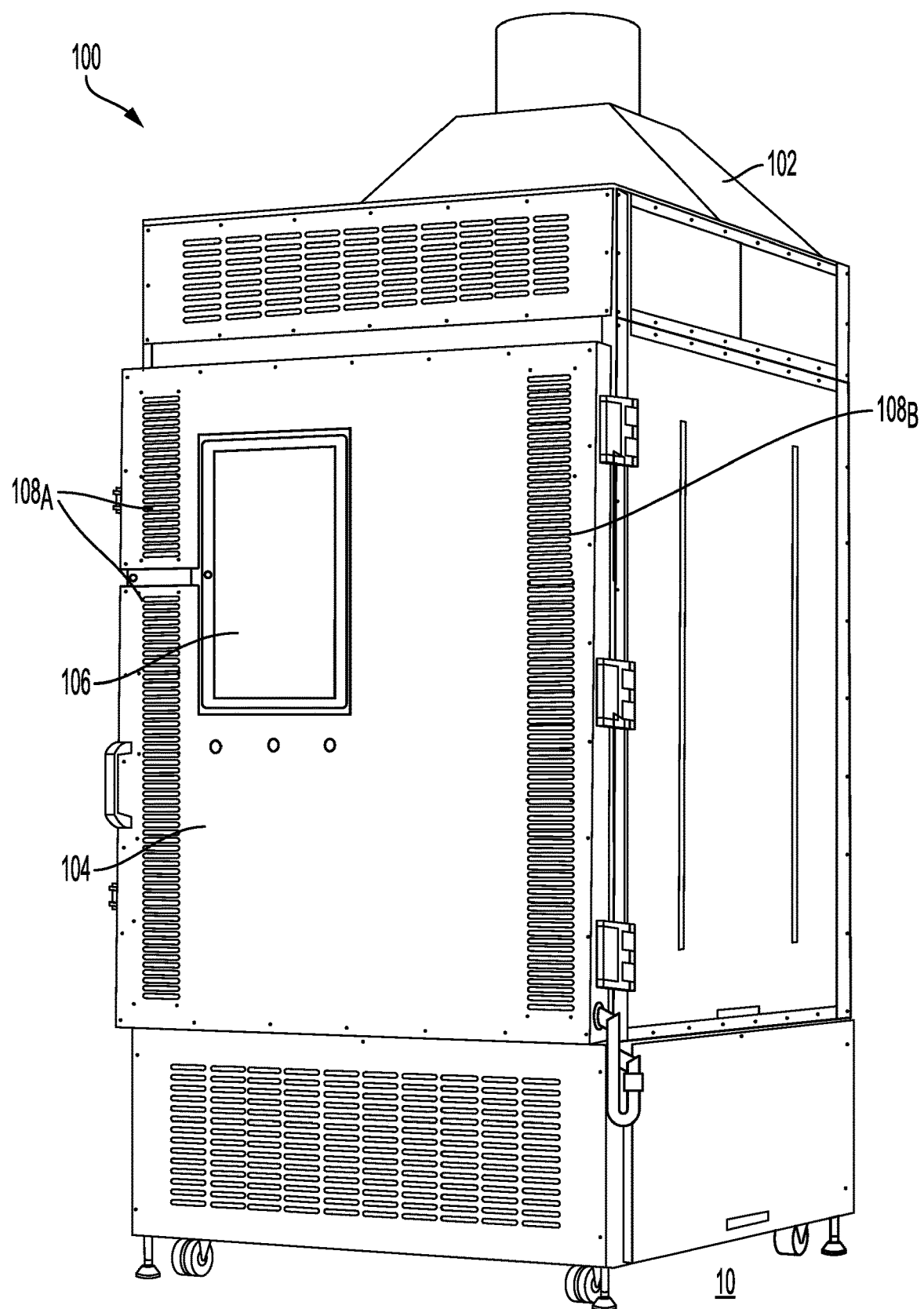
FIG. 1 is a front perspective view of an exterior of a testing apparatus according to one or more embodiments.

FIG. 1 is a front perspective view of an exterior of testing apparatus 100 according to one or more embodiments. Testing apparatus 100 is used to provide temperature-controlled testing of electronic devices, referred to herein as Devices Under Test (DUTs). In some implementations, testing apparatus 100 can be used, for example, to test Data Storage Devices (DSDs), such as Solid State Drives (SSDs). The testing can be performed by, for example, a manufacturer as part of a quality control process or to test performance capabilities of the DUTs at different temperatures, such as data retention or to determine safe temperature operating limits.

As shown in FIG. 1, testing apparatus 100 rests on surface 10, which may be a floor or other substantially horizontal surface (e.g., within 5 degrees of a ground plane) for supporting testing apparatus 100. As used herein, horizontal or substantially horizontal can refer to a plane that is parallel or substantially parallel (e.g., within 5 degrees) to a surface upon which testing apparatus 100 rests (i.e., surface 10). Testing apparatus 100 includes door 104 that provides access to an interior chamber (e.g., chamber 140 in FIGS. 4 and 5A to 5C) that can receive the DUTs. Door 104 includes intake vents $108_A$ and $108_B$ for drawing in a fluid, such as air, from an exterior of testing apparatus 100 to cool the DUTs inside testing apparatus. As discussed in more detail below, dampers inside testing apparatus 100 (e.g., intake dampers 112 and exhaust dampers 114 in FIGS. 3 to 5C) can adjust an amount of exterior fluid or air drawn from outside testing apparatus 100 and exhausted from testing apparatus 100.

In this regard, testing apparatus 100 includes exhaust hood 102 for exhausting fluid from testing apparatus 100. The amount of fluid exhausted from testing apparatus 100 is controlled to adjust the relative amounts of fluid drawn into the chamber and recirculated or recycled within the chamber to reach or maintain a target temperature in the chamber. In other implementations, exhaust hood 102 may be omitted, such as by exhausting the fluid from testing apparatus 100 to an ambient exterior of testing apparatus 100, as opposed to directing the exhausted fluid to a vent.

Testing apparatus 100 also includes controller 106. In the example of FIG. 1, controller 106 is mounted in door 104. In other implementations, controller 106 may be in a different location, such as on a rear or side of testing apparatus 100. Controller 106 may be used to control dampers and fans (e.g., fans 120 in FIGS. 3 to 5C) inside testing apparatus 100 to reach or maintain a target temperature inside a chamber of testing apparatus 100, as detected by one or more temperature sensors inside the chamber (e.g., temperature sensors 136 and 138 in FIGS. 5A to 5C). In some implementations, controller 106 may also control at least one heater (e.g., heaters 126 in FIGS. 5A to 5C) based on one or more detected temperatures. Controller 106 may include, for example, a Programmable Logic Controller (PLC), or other type of controller or processor circuitry.

As will be appreciated by those of ordinary skill in the art with reference to the present disclosure, other implementations of testing apparatus 100 can include a different arrangement or number of components than shown in the example of FIG. 1. For example, other implementations may include a different number of intake vents 108 or a different footprint of testing apparatus 100, such that testing apparatus 100 may be a bench-mounted testing apparatus.

Figure 2:
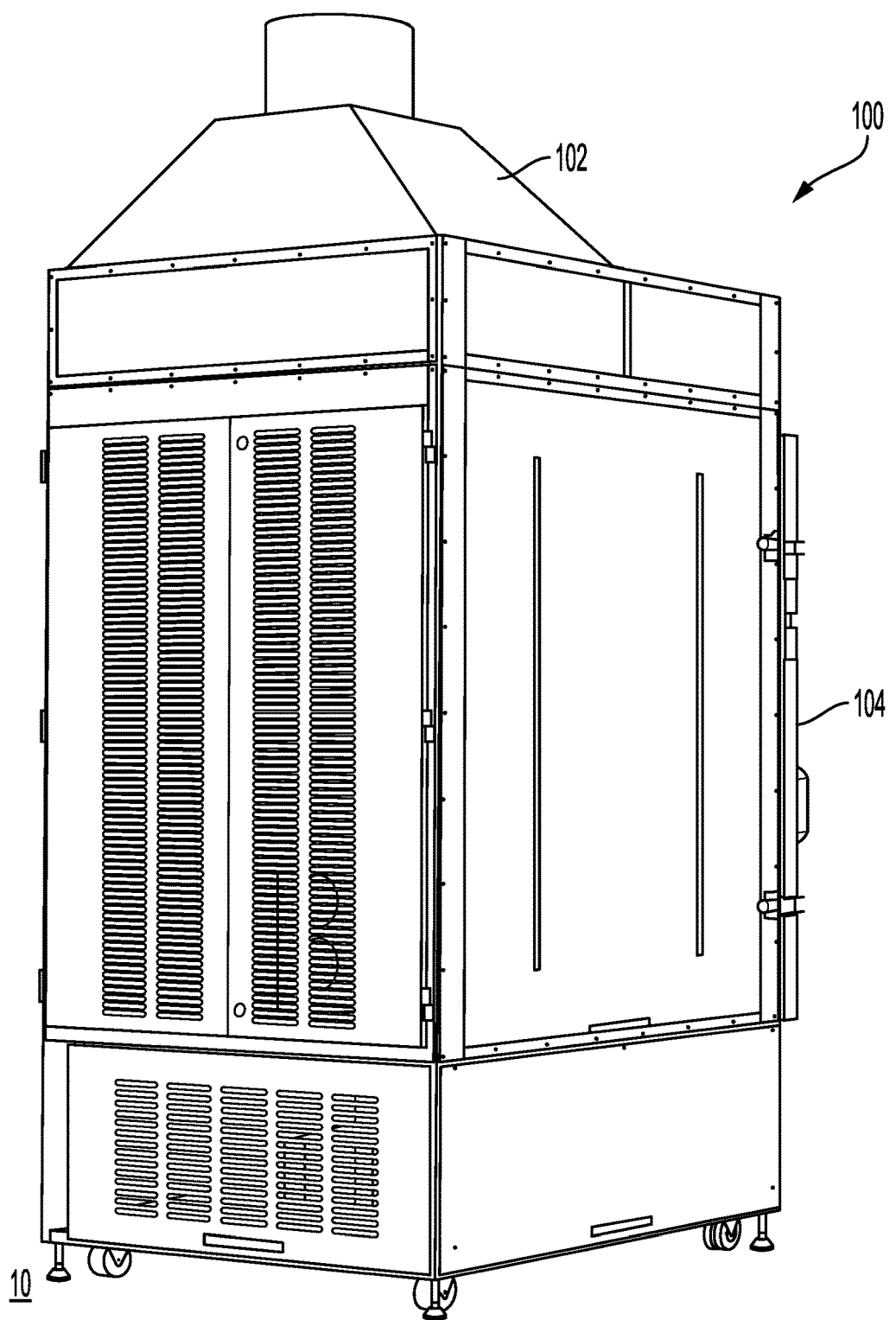
FIG. 2 is a rear perspective view of the exterior of the testing apparatus of FIG. 1 according to one or more embodiments.

FIG. 2 is a rear perspective view of the exterior of testing apparatus 100 according to one or more embodiments. As shown in FIG. 2, the rear of testing apparatus 100 can include other vents in addition to intake vents 108 on the front of testing apparatus 100 for testing components, such as interface cards for connecting to the DUTs tested in testing apparatus 100.

Figure 3:
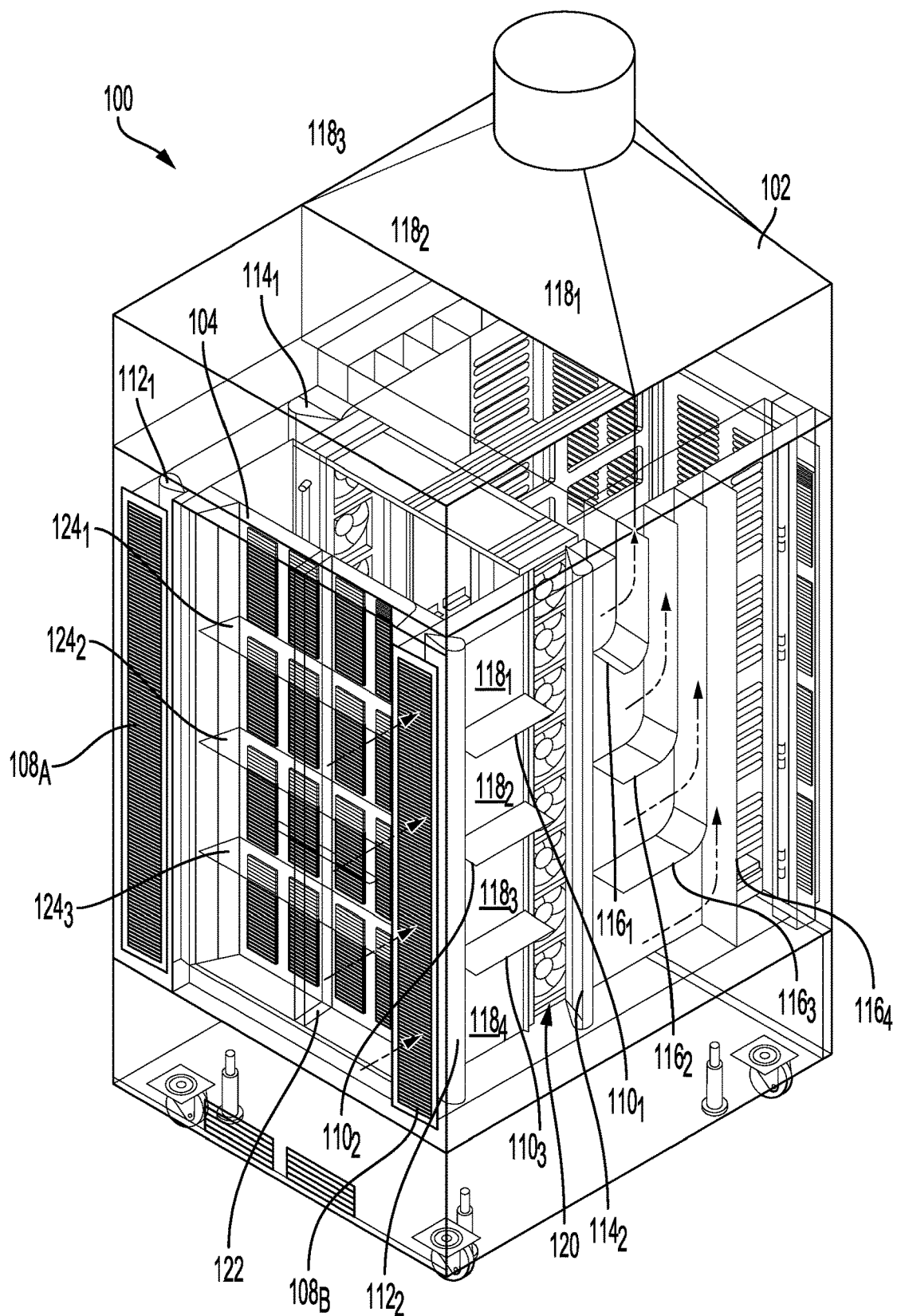
FIG. 3 is a front perspective view of a testing apparatus with certain interior components exposed according to one or more embodiments.

FIG. 3 is a front perspective view of testing apparatus 100 with certain interior components exposed according to one or more embodiments. As shown in FIG. 3, intake dampers $112_1$ and $112_2$ can adjust the amount of exterior fluid (e.g., air) drawn into a chamber of testing apparatus 100 through intake vents $108_A$ and $108_B$, which is shown by the arrows pointing into vent $108_B$. In the example of FIG. 3, door 104 includes a channel (e.g., channels 130 in FIGS. 5A to 5C) for each horizontal fluid flow zone. In this regard, the interior of testing apparatus 100 includes four horizontally stacked fluid flow zones $118_1$, $118_2$, $118_3$, and $118_4$. The four horizontally stacked fluid flow zones 118 are defined by separator elements $110_1$, $110_2$, and $110_3$, and by corresponding separator elements $124_1$, $124_2$, and $124_3$ inside door 104, which also form the channels within door 104.

In addition, each fluid flow zone includes two fans 120 on each side that moves fluid for the fluid flow zone across one or more DUTs in the fluid flow zone. The horizontal arrangement of the DUTs in rows with corresponding horizontally stacked or layered fluid flow zones can allow for a greater number of DUTs in the testing apparatus that can receive approximately the same fluid flow at the approximately the same temperature. In conventional testing apparatus where DUTs may be arranged vertically in a column, the amount of fluid flowing over the DUTs is generally not divided equally among the DUTs, resulting in wider variances in the temperatures in the testing chamber.

In the example of FIG. 3, the channels of door 104 are divided into a left and a right compartment by internal wall 122. As discussed in more detail below with reference to FIGS. 5A to 5C, fluid can be drawn in from outside of testing apparatus 100 by opening intake dampers $112_1$ and $112_2$ and opening exhaust dampers $114_1$ and $114_2$ so that fans 120 can draw the fluid through intake vents $108_A$ and $108_B$, through the channels of door 104, and out from fans 120 up through exhaust hood 102.

The use of channels in door 104 can facilitate an easy front access of the DUTs in chamber 140 while still providing a relatively even fluid flow from the across the fronts of each of the DUTs in the one or more rows. In contrast, a conventional testing apparatus that may provide a front access via a door without such fluid flow channels in the door would provide an inconsistent fluid flow from a side, top, or bottom of the DUTs where DUTs that are in the middle of the row or column would receive less fluid and/or fluid that has already been heated by DUTs that are upstream. In testing apparatus 100, the fluid flow channels in door 104 allow for an easy front access to all the DUTs while ensuring that none of the DUTs are downstream of another DUT.

Guide vanes $116_1$, $116_2$, and $116_3$ direct fluid from fans 120 up through exhaust hood 102. Intake dampers 112 and exhaust dampers 114 can be actuated in conjunction to increase or decrease the amount of air that is drawn into and exhausted from testing apparatus 100. As discussed in more detail below with reference to FIGS. 5A to 5C some or all of the fluid drawn into testing apparatus 100 may be recirculated from fans 120 back to the channels of door 104 to approximately maintain a target temperature (e.g., within 3 degrees Celsius) in chamber 140. The recirculated fluid can move in a clockwise or a counterclockwise direction with respect to a virtual plane (e.g., virtual plane 12 in FIGS. 5A to 5C).

Those of ordinary skill in the art will appreciate with reference to the present disclosure that other implementations may include a different arrangement or a different number of components than shown in FIG. 3. For example, other implementations may include a different number of fans 120 per fluid flow zone 118, a single horizontal fluid flow zone 118, or separate intake dampers 112 or exhaust dampers 114 for each fluid flow zone 118.

Figure 4:
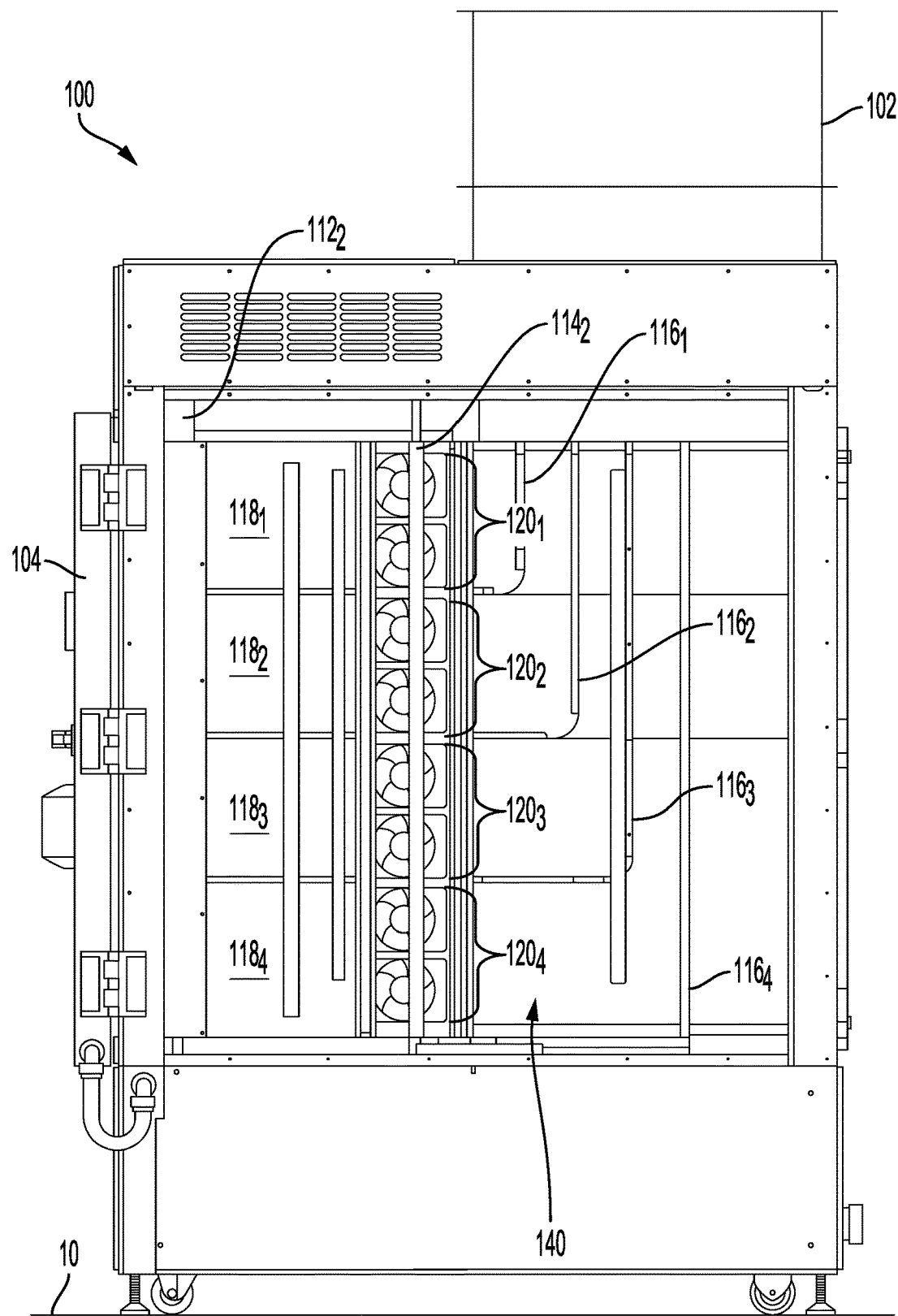
FIG. 4 is a side view of a testing apparatus with certain interior components exposed according to one or more embodiments.

FIG. 4 is a side view of testing apparatus 100 with certain interior components exposed according to one or more embodiments. As shown in FIG. 4, fluid flow zones $118_1$, $118_2$, $118_3$, and $118_4$ include fans $120_1$, $120_2$, $120_3$, and $120_4$, respectively. The volumes of horizontal flow zones 118 are sized to provide a uniform flow of fluid for each flow zone 118. By stacking the fluid flow zones 118 horizontally with respect to surface 10, it is ordinarily possible to obtain a more uniform flow of fluid across a large number of DUTs in the testing chamber, and thereby more consistent temperatures among the DUTs.

Figure 5A:
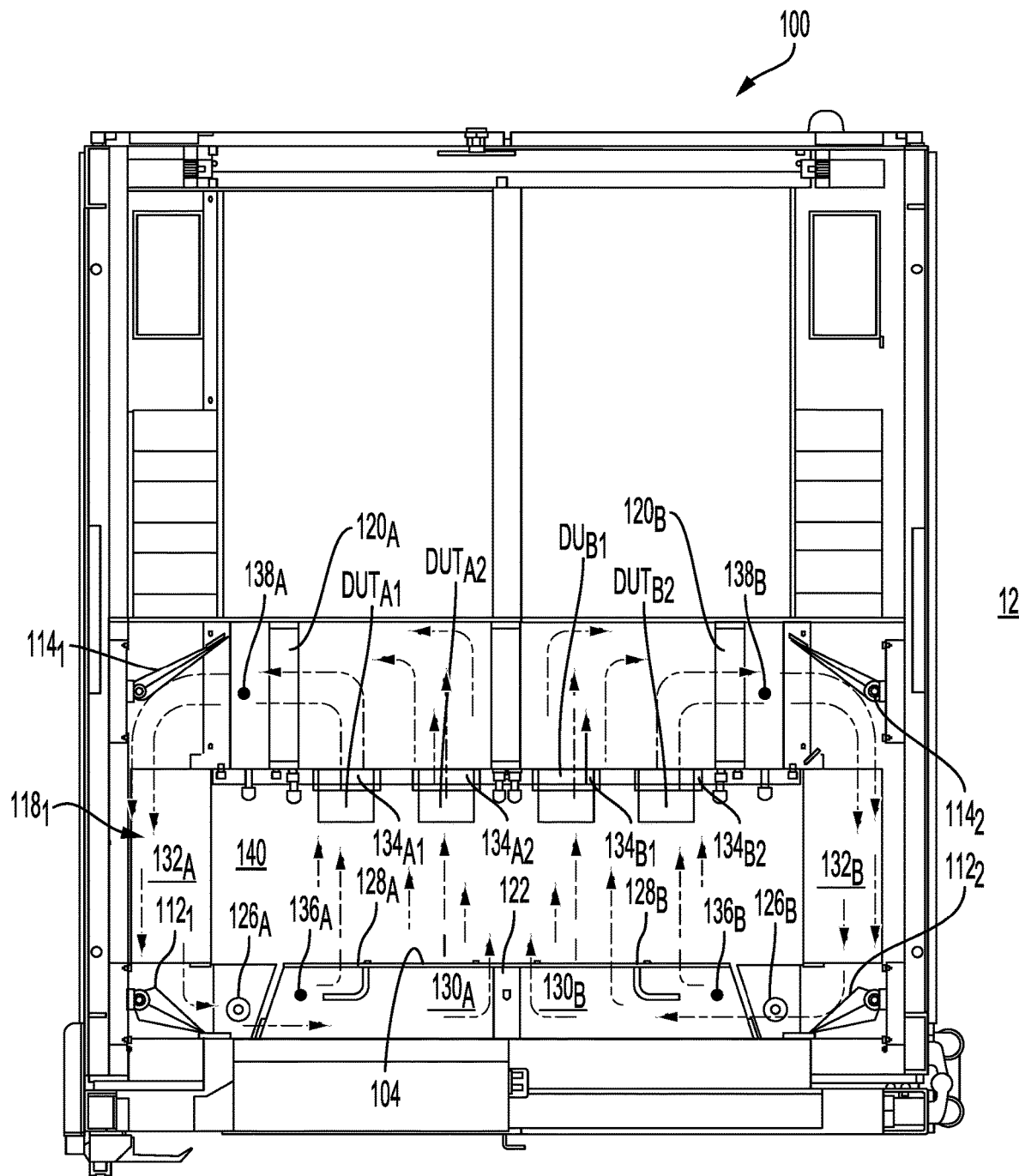
FIG. 5A is a top view of a fluid flow zone in a testing apparatus in a recirculation mode according to one or more embodiments.

FIG. 5A is a top view of a fluid flow zone in testing apparatus 100 in a recirculation mode according to one or more embodiments where all or most of the fluid is recirculated or recycled within the fluid flow zone. As shown by the broken arrows in the example of FIG. 5A, fluid is recirculated in a counterclockwise direction with respect to virtual plane 12 in a left half of chamber 140 across $DUT_{A1}$ and $DUT_{A2}$. In addition, fluid is recirculated in a clockwise direction with respect to virtual plane 12 in a right half of chamber 140 across $DUT_{B1}$ and $DUT_{B2}$. Chamber 140 in FIG. 5A includes the fluid flow zone, and virtual plane 12 is substantially parallel (e.g., within 5 degrees) to surface 10 shown in FIG. 4, which may be horizontal or substantially horizontal as discussed above.

As shown in FIG. 5A, the fluid is moved across the DUTs in a direction that is substantially from the front of chamber 140 where door 104 is located towards a rear of chamber 140 behind the DUTs. The fluid flows are then drawn through fans $120_A$ and $120_B$, respectively, and directed back towards the front of testing apparatus 100 via passages $132_A$ and $132_B$, respectively. The recirculated fluid flows are directed back into door 104 by closed intake dampers $112_1$ and $112_2$, where the fluid flows enter channels $130_A$ and $130_B$, respectively.

In the example of FIG. 5A, intake dampers $112_1$ and $112_2$ are closed so that little or no fluid is drawn into fluid flow zone $118_1$ from the outside of testing apparatus 100. Exhaust dampers $114_1$ and $114_2$ are similarly closed so that little or no fluid is exhausted from fluid flow zone $118_1$. This closed configuration of intake dampers 112 and exhaust dampers 114 can allow for the temperature inside chamber 140 to increase to reach a target temperature. In some implementations, heater $126_A$ and/or heater $126_B$ may be activated to further increase the temperature in chamber 140. Heaters 126 can include, for example, variable resistance heaters that may be controlled by controller 106 to reach a target temperature. In some implementations, controller 106 may control heaters 126 in stages, such as by using a high heat stage and/or a low heat stage to reach the target temperature.

The temperature of chamber 140 may be detected using front temperature sensors $136_A$ and $136_B$ and rear temperature sensors $138_A$ and $138_B$. In some implementations, controller 106 (shown in FIG. 1) may average the temperatures detected at temperature sensors 136 and 138, and control intake dampers 114, exhaust dampers 114, and heaters 126 based on the average temperature. In other implementations, the dampers and heaters on the left and right sides may be independently controlled based at least in part on the temperatures detected on the left and right sides. In such implementations, temperatures detected by temperature sensors $136_A$ and $138_A$ for the left side can be used to control intake damper $112_A$, exhaust damper $114_A$, and heater $126_A$, while temperatures detected by temperature sensors $136_B$ and $138_B$ for the right side can be used to control intake damper $112_B$, exhaust damper $114_B$, and heater $126_B$. Those of ordinary skill in the art will appreciate that the number and location of temperature sensors 136 may differ in other implementations.

As shown in FIG. 5A, the DUTs are arranged in a row in chamber 140. In the left half of chamber 140, $DUT_{A1}$ is received in slot $134_{A1}$ and $DUT_{A2}$ is received in slot $134_{A2}$. In the right half of chamber 140, $DUT_{B1}$ is received in slot $134_{B1}$ and $DUT_{B2}$ is received in slot $134_{B2}$. In some implementations, each slot may provide or guide the DUT into an interface card used to communicate with the DUT. Examples of such interfaces are provided in related application Ser. No. 17/458,045, which is incorporated by reference above. A different number of DUTs per row may be used in other implementations. For example, other implementations may only include a single DUT or may include eight DUTs per row.

Door 104 in the example of FIG. 5A includes dividers $128_A$ and $128_B$ on opposite sides of internal wall 122 in channels $130_A$ and $130_B$, respectively. Divider $128_A$ divides the fluid flowing in channel $130_A$ among $DUT_{A1}$ and $DUT_{A2}$ to more equally distribute the fluid between the DUTs. For its part, divider $128_B$ divides the fluid flowing in channel $130_B$ among $DUT_{B1}$ and $DUT_{B2}$.

Those of ordinary skill in the art with reference to the present disclosure will appreciate that other implementations may include a different arrangement or a different number of components than shown in FIG. 5A. For example, other implementations may only include a single recirculation loop instead of a left loop and a right loop, may not include heaters 126, or may include more temperature sensors in different locations.

Figure 5B:
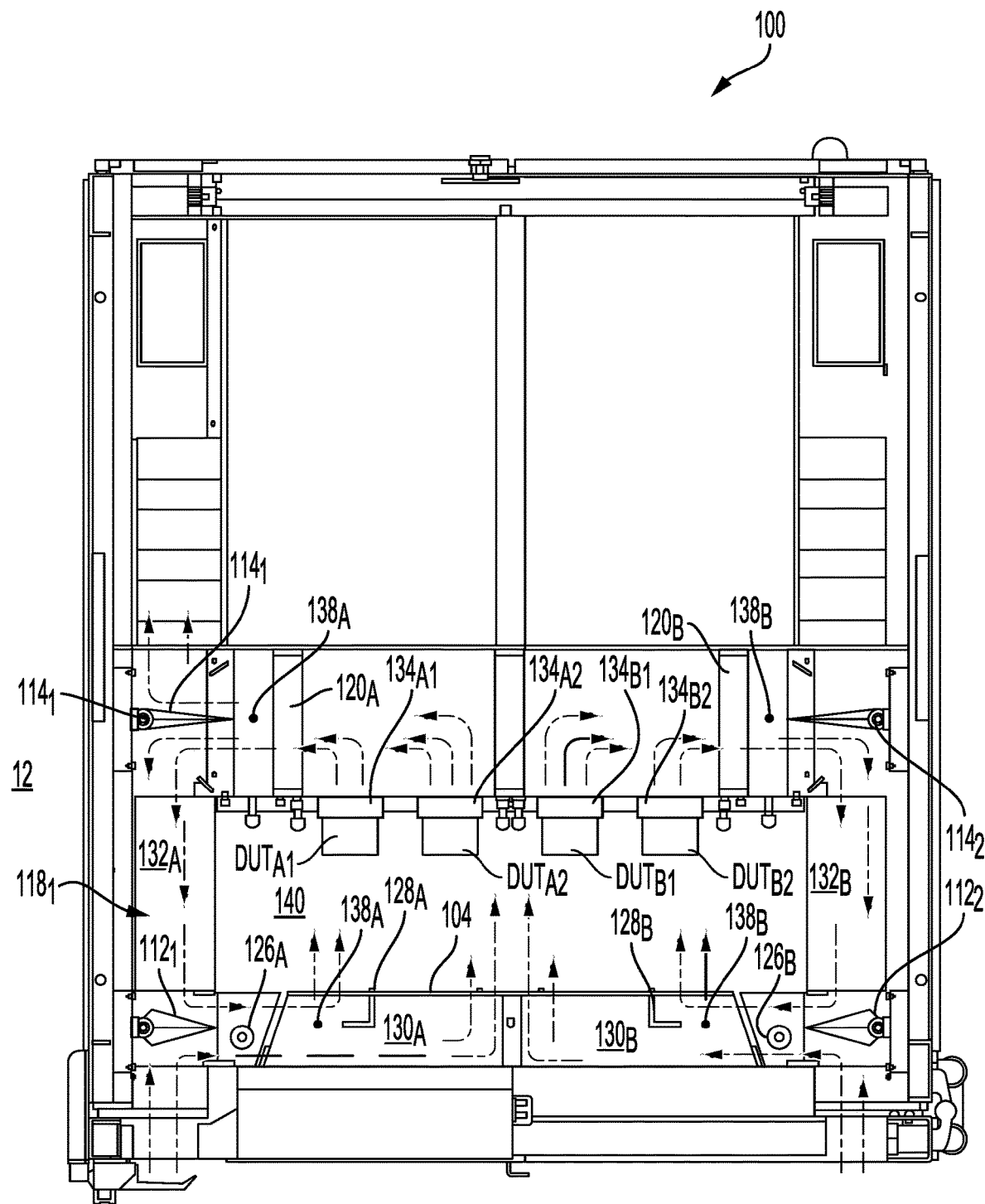
FIG. 5B is a top view of the fluid flow zone of FIG. 5A in a mixing mode according to one or more embodiments.

FIG. 5B is a top view of the fluid flow zone of FIG. 5A in a mixing mode according to one or more embodiments where exterior fluid is mixed with recirculated fluid in fluid flow zone $118_1$. As shown in FIG. 5B, intake dampers 112 and exhaust dampers 114 are at an intermediate position between fully open and fully closed so that approximately half of the fluid is recirculated or recycled in chamber 140. A controller, such as controller 106 in FIG. 1, may control the positions of intake dampers 112 and exhaust dampers 114 to reach or maintain the temperature or temperatures detected in testing apparatus 100 at a target temperature. The exterior fluid is mixed with the recirculated fluid in channels $130_A$ and $130_B$ in door 104 before reaching chamber 140 and the DUTs to provide a more uniform temperature of the fluid flow.

As will be appreciated by those with ordinary skill in the art, the positions of dampers 112 and 114 may be actuated to other intermediate positions between being fully open and fully closed to increase, decrease, or maintain the detected temperature or temperatures in testing apparatus 100. In some implementations, dampers $112_1$ and $114_1$ may be controlled separately of dampers $112_2$ and $114_2$ to provide independent temperature control of the left and right halves of fluid flow zone $118_1$.

Figure 5C:
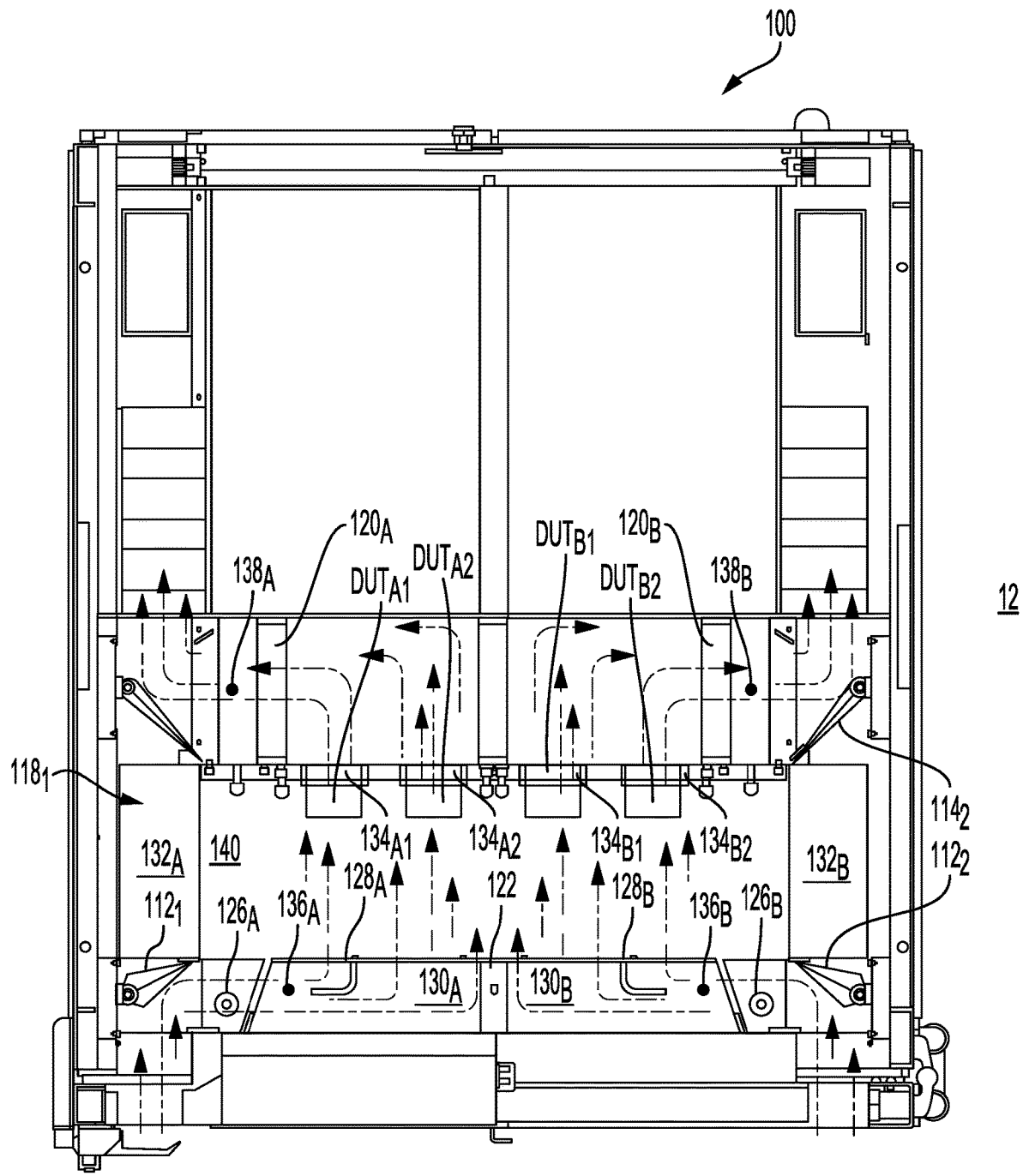
FIG. 5C is a top view of the fluid flow zone of FIG. 5A in a cooling mode according to one or more embodiments.

FIG. 5C is a top view of the fluid flow zone of FIG. 5A in a cooling mode according to one or more embodiments where all, or nearly all, of the fluid is exhausted from fluid flow zone $118_1$. As shown in FIG. 5C, intake dampers 112 and exhaust dampers 114 are at a fully open position so that all, or nearly all, of the fluid is exhausted from testing apparatus 100 and replaced with exterior fluid via intake dampers 112. A controller, such as controller 106 in FIG. 1, may control the positions of intake dampers 112 and exhaust dampers 114 to open to decrease or maintain the temperature or temperatures detected in testing apparatus 100 based on a target temperature. As noted above, dampers $112_1$ and $114_1$ may be controlled separately from dampers $112_2$ and $114_2$ to provide independent temperature control of the left and right halves of fluid flow zone $118_1$.

As discussed above, the foregoing adjustments to intake and exhaust dampers can provide for improved temperature control in a testing chamber. In addition, the separation of fluid flows using the horizontally-orientated fluid flow zones disclosed herein can provide a more uniform fluid flow over the DUTs. In yet another advantageous arrangement disclosed above, the door of the testing apparatus can include one or more channels for directing fluid from the front of the testing apparatus to the rear of the apparatus, thereby allowing for each DUT in a row to receive approximately the same amount of fluid flow while still facilitating easy access to the DUTs.

OTHER EMBODIMENTS

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes processor or controller circuitry to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, processor circuitry, and controller circuitry described in connection with the examples disclosed herein may be implemented or performed with a general purpose processor, a PLC, a GPU, a DSP, an ASIC, an FPGA or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. Processor or controller circuitry may also be implemented as a combination of computing devices, e.g., a combination of a DSP and a microprocessor, a plurality of microprocessors, an SoC, one or more microprocessors in conjunction with a DSP core, or any other such configuration.

The activities of a method or process described in connection with the examples disclosed herein may be embodied directly in hardware, in a software module executed by processor or controller circuitry, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable media, an optical media, or any other form of storage medium known in the art. An exemplary storage medium is coupled to processor or controller circuitry such that the processor or controller circuitry can read information from, and write information to, the storage medium. In the alternative, the storage medium may be integral to processor or controller circuitry. The processor or controller circuitry and the storage medium may reside in an ASIC or an SoC.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive. In addition, the use of language in the form of "at least one of A and B" in the following claims should be understood to mean "only A, only B, or both A and B."

What is claimed is:

1. A testing apparatus for testing Devices Under Test (DUTs), the testing apparatus comprising:
    slots for receiving DUTs inside the testing apparatus, wherein the slots are arranged in at least one row;
    at least one intake damper configured to adjust an amount of exterior fluid drawn from outside the testing apparatus;
    at least one exhaust damper configured to adjust at least one of an amount of exhaust fluid that is exhausted from the testing apparatus and an amount of recirculated fluid that is recirculated in the testing apparatus; and
    at least one fan configured to move the recirculated fluid and the exterior fluid across one or more DUTs inside the testing apparatus, wherein the recirculated fluid moves in a clockwise or a counterclockwise direction with respect to a virtual plane across the DUTs in the at least one row.

2. The testing apparatus of claim 1, further comprising a plurality of fluid flow zones, wherein a fluid flow zone of the plurality of fluid flow zones includes:
    one or more fans configured to move the recirculated fluid and the exterior fluid for the fluid flow level across one or more DUTs in the fluid flow zone; and
    at least one separator element configured to separate fluid flow between the fluid flow zone and an adjacent fluid flow zone of the plurality of fluid flow zones.

3. The testing apparatus of claim 2, wherein the fluid flow zones of the plurality of fluid flow zones are stacked substantially horizontally with respect to a surface on which the testing apparatus rests.

4. The testing apparatus of claim 1, further comprising a controller configured to control the at least one intake damper and the at least one exhaust damper to approximately maintain a target temperature inside the testing apparatus.

5. The testing apparatus of claim 1, further comprising a door for accessing an interior of the testing apparatus, wherein the door includes a channel for a fluid flow including at least one of the recirculated fluid and the exterior fluid.

6. The testing apparatus of claim 5, wherein the channel is configured to mix the exterior fluid with the recirculated fluid.

7. The testing apparatus of claim 5, wherein the channel includes a divider configured to divide at least one of the recirculated fluid and the exterior fluid among a plurality of storage devices in the testing apparatus.

8. A testing apparatus for testing Devices Under Test (DUTs), the testing apparatus comprising:
    a chamber configured to receive the DUTs;
    at least one intake damper configured to adjust an amount of exterior fluid drawn from outside the testing apparatus;
    a door configured to provide access to the chamber, the door including at least one channel; and
    at least one fan configured to move fluid across one or more DUTs inside the chamber, wherein the at least one intake damper is further configured to direct recirculated fluid into the at least one channel of the door.

9. The testing apparatus of claim 8, further comprising a plurality of fluid flow zones, wherein a fluid flow zone of the plurality of fluid flow zones includes:
    one or more fans configured to move fluid for the fluid flow zone across one or more DUTs in the fluid flow zone; and
    at least one separator element configured to separate fluid flow between the fluid flow zone and an adjacent fluid flow zone of the plurality of fluid flow zones.

10. The testing apparatus of claim 8, wherein the fluid flow zones are stacked horizontally with respect to a surface upon which the testing apparatus rests.

11. The testing apparatus of claim 9, further comprising:
    at least one exhaust damper configured to adjust at least one of an amount of exhaust fluid that is exhausted from the testing apparatus and an amount of recirculated fluid that is recirculated in the testing apparatus; and
    a controller configured to control the at least one intake damper and the at least one exhaust damper to maintain a target temperature inside the testing apparatus.

12. The testing apparatus of claim 11, wherein the at least one channel is configured to mix the exterior fluid with the recirculated fluid.

13. The testing apparatus of claim 8, wherein the at least one channel includes a divider configured to divide the fluid flowing in the channel among a plurality of DUTs in the testing apparatus.

14. The testing apparatus of claim 8, further comprising slots for receiving DUTs in the chamber, wherein the slots are arranged in at least one row such that recirculated fluid moves in a clockwise or a counterclockwise direction with respect to a virtual plane across the storage devices in the at least one row.

15. The testing apparatus of claim 8, wherein the at least one intake damper is further configured to direct the amount of exterior fluid into the at least one channel of the door.

16. A testing apparatus for testing Devices Under Test (DUTs), the testing apparatus comprising:
    a chamber configured to receive the DUTs;
    at least one intake damper configured to adjust an amount of exterior fluid drawn from outside the testing apparatus;
    a door at a front of the chamber opposite a rear of the chamber, wherein the door is configured to provide access to the chamber from the front of the chamber and includes at least one channel; and
    means for moving fluid across one or more DUTs inside the chamber; and wherein the at least one intake damper is further configured to direct recirculated fluid into the at least one channel of the door.

17. The testing apparatus of claim 16, further comprising:
at least one exhaust damper configured to adjust at least one of an amount of exhaust fluid that is exhausted from the testing apparatus and an amount of recirculated fluid that is recirculated in the testing apparatus.

18. The testing apparatus of claim 16, further comprising a plurality of fluid flow zones, wherein a fluid flow zone of the plurality of fluid flow zones includes:
means for moving fluid across one or more DUTs in the fluid flow zone; and
at least one separator element configured to separate fluid flow between the fluid flow zone and an adjacent fluid flow zone of the plurality of fluid flow zones.

19. The testing apparatus of claim 16, wherein the at least one channel is further configured to direct the fluid from the front of the chamber toward the one or more DUTs.

20. The testing apparatus of claim 16, wherein the at least one channel includes a divider configured to divide fluid flowing in the channel among a plurality of DUTs in the testing apparatus.

* * * * *